(12) United States Patent
Singh et al.

(10) Patent No.: US 6,221,777 B1
(45) Date of Patent: Apr. 24, 2001

(54) REVERSE LITHOGRAPHIC PROCESS FOR SEMICONDUCTOR VIAS

(75) Inventors: Bhanwar Singh, Morgan Hill; Bharath Rangarajan, Santa Clara; Ursula Q. Quinto, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/329,154

(22) Filed: Jun. 9, 1999

(51) Int. Cl.[7] ..................................................... H01L 21/00
(52) U.S. Cl. ......................... 438/692; 438/723; 438/725; 438/633; 438/636; 438/637
(58) Field of Search ..................................... 438/692, 719, 438/721, 723, 724, 725, 734, 736, 738, 740, 743, 744, 633, 636, 637, 672; 216/38, 67, 79, 88

(56) References Cited

U.S. PATENT DOCUMENTS

| | | | |
|---|---|---|---|
| 4,973,544 | 11/1990 | Slayman et al. | 430/323 |
| 5,510,216 | 4/1996 | Calabrese et al. | 430/16 |
| 5,716,758 | 2/1998 | Bae et al. | 430/312 |
| 5,741,625 | 4/1998 | Bae et al. | 430/312 |
| 5,750,441 | * 5/1998 | Figura et al. | 438/743 X |
| 5,811,357 | * 9/1998 | Armacost et al. | 438/723 |
| 5,834,159 | 11/1998 | Stolmeijer | 430/312 |
| 5,897,984 | 4/1999 | Kubota et al. | 430/320 |
| 5,908,735 | 6/1999 | Kim et al. | 430/329 |
| 5,935,765 | 8/1999 | Tanaka et al. | 430/315 |
| 5,981,385 | 11/1999 | Huang | 438/672 |
| 6,022,669 | 2/2000 | Uchida et al. | 430/313 |
| 6,027,858 | 2/2000 | Jones et al. | 430/311 |
| 6,063,702 | 5/2000 | Chung | 438/624 |
| 6,074,803 | 6/2000 | McGrath et al. | 430/311 |
| 6,080,662 | * 6/2000 | Chen et al. | 438/723 X |

FOREIGN PATENT DOCUMENTS 0 559 934 A1    9/1993   (EP).

* cited by examiner

Primary Examiner—William Powell
(74) Attorney, Agent, or Firm—Mikio Ishimaru

(57) ABSTRACT

A reverse lithographic process is provided for more densely packing semiconductors onto a semiconductor wafer. A semiconductor wafer having a dielectric covered semiconductor device has a photoresist deposited which is patterned with vias in closely packed rows and columns. The resist is developed and trimmed to form via photoresist structures. A non-photosensitive polymer is deposited over the via photoresist structures and, when hardened, is subject to planarizing to expose the via photoresist structures. The via photoresist structures are removed and leave a reverse image patterned polymer. The photoresist is removed leaving the reverse image patterned polymer, which is then used to etch the dielectric to form vias to the semiconductor device.

20 Claims, 5 Drawing Sheets

REVERSE LITHOGRAPHIC PROCESS FOR SEMICONDUCTOR VIAS

CROSS-REFERENCE TO RELATED APPLICATIONS

The present application contains subject matter related to a concurrently filed and copending U.S. Patent Application by Bhanwar Singh, Bharath Rangarajan, and Ursula Q. Quinto entitled "REVERSE LITHOGRAPHIC PROCESS FOR SEMICONDUCTOR SPACES". The related application was filed on Jun. 9, 1999 is assigned to Advanced Micro Devices, Inc. and is identified by U.S. application Ser. No. 09/329,153.

TECHNICAL FIELD

The present invention relates generally to manufacturing of submicron semiconductors and more specifically to providing more densely packed semiconductor devices.

BACKGROUND ART

An integrated circuit includes a large number of closely spaced semiconductor devices formed into and on a semiconductor substrate, typically comprising silicon. Isolation structures such as field dielectrics or shallow trench dielectrics are used to electrically isolate each individual device. A major goal in the semiconductor industry has been to reduce device size and spacing to achieve denser and denser packing.

More specifically, it has been a goal to reduce the size of memory devices such as Flash electrically erasable programmable read only memories (EEPROMs), which are a class of nonvolatile memory devices that are programmed by hot electron injection and erased by Fowler-Nordheim tunneling.

Each memory cell is formed on a semiconductor substrate (i.e., a silicon die or chip), having a heavily doped drain region and a source region embedded therein. The source region further contains a lightly doped, deeply diffused region and a more heavily doped, shallow diffused region embedded into the substrate. A channel region separates the drain region and the source region. The memory cell further includes a multi-layer structure, commonly referred to as a "stacked gate" structure or word line. The stacked gate structure typically includes: a thin gate dielectric (tunnel oxide) layer formed on the surface of substrate overlying the channel region; a floating gate overlying the tunnel oxide; an interpoly dielectric overlying the floating gate; and a control gate overlying the interpoly dielectric layer. Additional layers, such as a silicide layer (disposed on the control gate), a poly cap layer (disposed on the silicide layer), and a silicon oxynitride layer (disposed on the poly cap layer) may be formed over the control gate. A plurality of Flash EEPROM cells may be formed on a single substrate.

The process of forming Flash EEPROM cells is well known and widely practiced throughout the semiconductor industry. After the formation of the memory cells, electrical connections, commonly known as "contacts", must be made to connect the stack gate structures, the source regions and the drain regions to other part of the chip. The contact process starts with the formation of sidewall spacers around the stacked gate structures of each memory cell. An etchstop layer, typically a silicon nitride material, is then formed over the entire substrate, including the stacked gate structure, using conventional techniques, such as chemical vapor deposition (CVD). A dielectric layer of oxide is then deposited over the nitride layer. A layer of photoresist is then placed over the dielectric layer and is photolithographically processed to form the pattern of contact openings. An anisotropic dielectric etch is then used to etch out portions of the dielectric layer to form the gate, source and drain contact openings. The contact openings stop at the etch-stop layer. An etch-stop etch is then used to remove the etch-stop layer so that the source and drain contact openings reach the source and drain region respectively. A poly etch is then performed to etch the poly cap layer so that the gate contact openings reach the silicide layer on the stacked gate structure. The photoresist is then stripped. A conductive material, such as tungsten, is then deposited over the dielectric layer and fills the gate, source and drain contact openings to form conductive plugs. The substrate is then subjected to a chemical-mechanical polishing process which removes the conductive material above the dielectric layer.

For miniaturization, it is desirable to dispose adjacent stacked gate structures and the contacts as closely together as possible.

Individual devices are selectively interconnected after formation to other devices to achieve a desired function. One selective interconnection process for individual devices is accomplished by forming electrical channels which are connected to the contacts and to each other by connections called "vias" (the term "vias" is used collectively herein to refer to both contacts and vias). Vias are formed in desired locations through the use of conventional photolithography and etch techniques, and forming a conductive layer on the upper surface of the insulating material. The conductive layer will fill the vias and can be patterned to selectively couple specified device contacts to achieve the desired function. This process of forming a conductive layer on an insulating layer containing a plurality of vias is commonly repeated such that the device contains multiple interconnect levels and multiple inter-level dielectric layers. Multiple level interconnects enable greater functional complexity and can reduce the average length of the interconnects thereby minimizing the RC delay imposed by the interconnects.

The lateral dimension of the via is typically smaller than the lateral dimension between the stacks and of the interconnects to ensure that the via opening does not overlap on to the stacks or different interconnects. If the via opening is larger than the interconnect, the via etch process may proceed through the dielectric layer upon which the interconnect is formed. This is typically an undesirable result. Thus, as critical dimensions drop below the sub-0.25 micron region, the critical dimensions of the vias must shrink to even smaller dimensions.

The main limitation of minimum feature size, i.e., devices and vias, in a semiconductor process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, it is possible to more closely control the width between lines than it is to control the size and location of vias.

The resolution of a lens depends on the wavelength of the illumination source and the numerical aperture of the lens.

Rayleigh's criteria define two images as being resolvable when the intensity between them drops to 50% of the image intensity. These criteria are the 2d=0.61 lambda/NA, where 2d is the separation distance of two images, lambda is the wavelength of the energy source, and NA is the numerical aperture of the lens.

Commercially available optical photolithography machines are almost universally equipped with mercury vapor lamps as the illumination source. The characteristic energy spectrum of a mercury vapor lamp contains several distinct peaks at 365 nm, 248 nm, and 193 nm wavelengths. These peaks are commonly referred to by their industry designations. The peak associated with a wavelength of about 365 nm peak is the "I-line" and peaks at about 248 nm and 193 nm are deep ultra-violet or "DUV".

Photolithography aligners are similarly designated such that it is common to speak of "I-line aligners" and "DUV aligners". The DUV aligners utilizing energy having wavelengths of 248 nm and 193 nm to achieve better resolution than is achievable with I-line aligners.

As process technologies approach and surpass the resolvable limits of optical aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in I-line aligners. To adequately resolve features in the sub-micron range, it is typically necessary to upgrade these aligners. Similarly, fabrication facilities with extensive investment in I-line aligners will eventually need to upgrade to DUV aligners or abandon the optical alignment equipment entirely and replace it with advanced lithography equipment including e-beam or x-ray lithography.

The cost associated with replacing or upgrading I-line and DUV photolithography equipment can be staggering. In addition to the capital required to purchase and install the improved equipment, there are extensive costs associated with qualifying the new equipment for production worthiness and training production and maintenance personnel in the operation and care of the new equipment. Similarly, in fabrication facilities that have extensive investments in I-line and DUV aligners, the costs of abandoning these aligners to achieve more densely packed devices is tremendous.

Thus, there have been intensive efforts to discover ways of using existing equipment and processes to achieve even incremental improvements in reducing spaces between and within semiconductor devices.

DISCLOSURE OF THE INVENTION

The present invention provides a reverse lithographic process for more densely packing semiconductors onto a semiconductor wafer. A semiconductor wafer having deposited a number of layers of semiconductor materials, has a photoresist deposited thereon. The photoresist is patterned with the vias as structures, and then developed and trimmed. A polymer is deposited over the via photoresist structures. The polymer, when hardened, is subject to chemical-mechanical polishing to expose the photoresist and form the reverse image patterned polymer. The photoresist is stripped leaving the reverse image patterned polymer. The reverse image patterned polymer is then used to etch the vias and the polymer is then removed.

The present invention further provides a reverse lithographic process for more densely packing memory devices onto a semiconductor wafer. A semiconductor wafer having deposited a number of closely packed memory devices, has a photoresist deposited thereon. The photoresist is patterned with the vias as cylinders, developed, and trimmed. A polymer is deposited over the via-cylinders, hardened, and subject to chemical-mechanical polishing to expose the photoresist and form a reverse image patterned polymer. The photoresist is removed leaving the reverse image patterned polymer. The reverse image patterned polymer is then used to etch the vias and the polymer is then removed.

The present invention further provides a system in which the overexposure of the photoresist layer during the stepper-patterning sequence can be used to form small vias. The process of making fine lines by overexposure of the photoresist during the stepper-patterning sequence is used in a reverse lithographic process to form small vias between semiconductor devices. The formation of small vias is difficult to pattern at underexposure conditions because scumming and bridging occurs.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
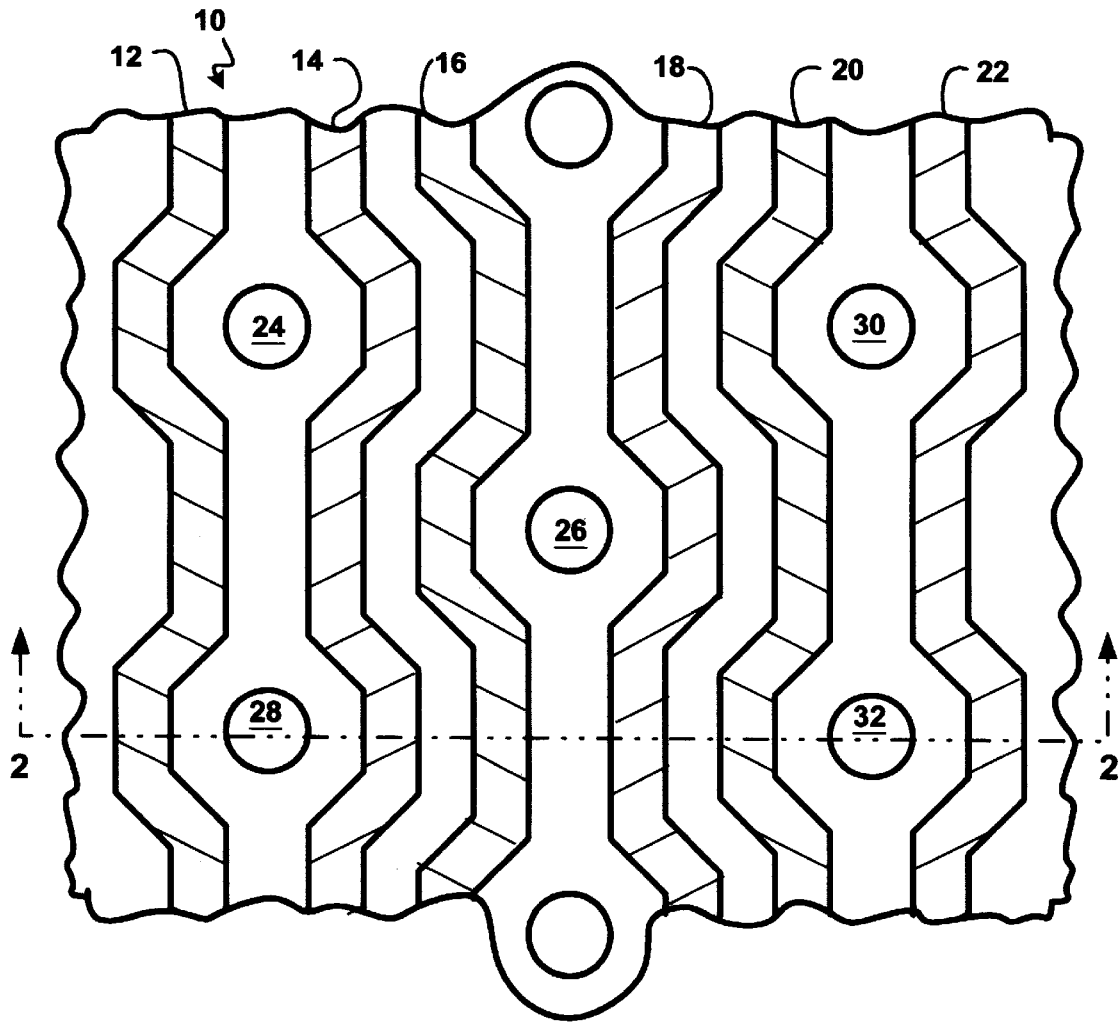
FIG. 1 (PRIOR ART) is a top view of a portion of a semiconductor wafer showing the prior art via arrangement.

Referring now to FIG. 1 (PRIOR ART), therein is shown a top view of a portion of a semiconductor wafer 10 showing the prior art arrangement of stacked gate structures 12, 14, 16, 18, 20, and 22. A plurality of "contacts" or "vias" 24, 26, 28, 30, and 32 are show between the stacked gate structures 12, 14, 16, 18, 20, and 22. It will be noted that the via 26 is diagonally positioned with regard to the row positioning of vias 24 and 30, and of vias 28 and 32, and also with regard to the column positioning of vias 24 and 28, and of vias 30 and 32. Also shown are the bends in the stacked gate structures 12, 14, 16, 18, 20, and 22 necessary to leave clearances around the vias 24, 26, 28, 30, and 32 while packing them as densely as possible.

Figure 2:
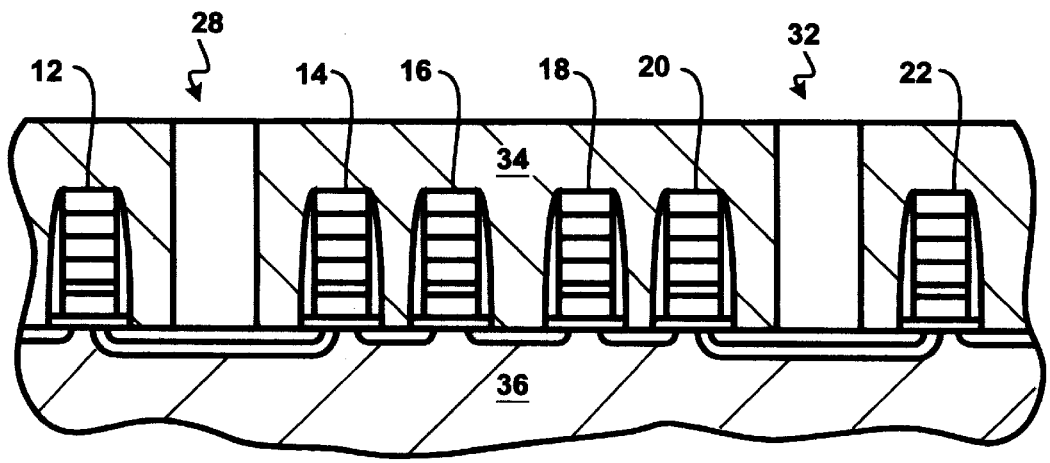
FIG. 2 (PRIOR ART) is a partial cross-sectional view of FIG. 1 (PRIOR ART) taken along line 2—2.

Referring now to FIG. 2 (PRIOR ART), therein is shown a partial cross-sectional view of FIG. 1 (PRIOR ART) taken along line 2—2. An interlayer dielectric 34 is deposited over the plurality of stacked gate structures 12, 14, 16, 18, 20, and 22 and a doped silicon substrate 36. The doping is shown at source/drain regions 38 and 40 to which the vias 28 and 32, respectively, are connected.

Figure 3:
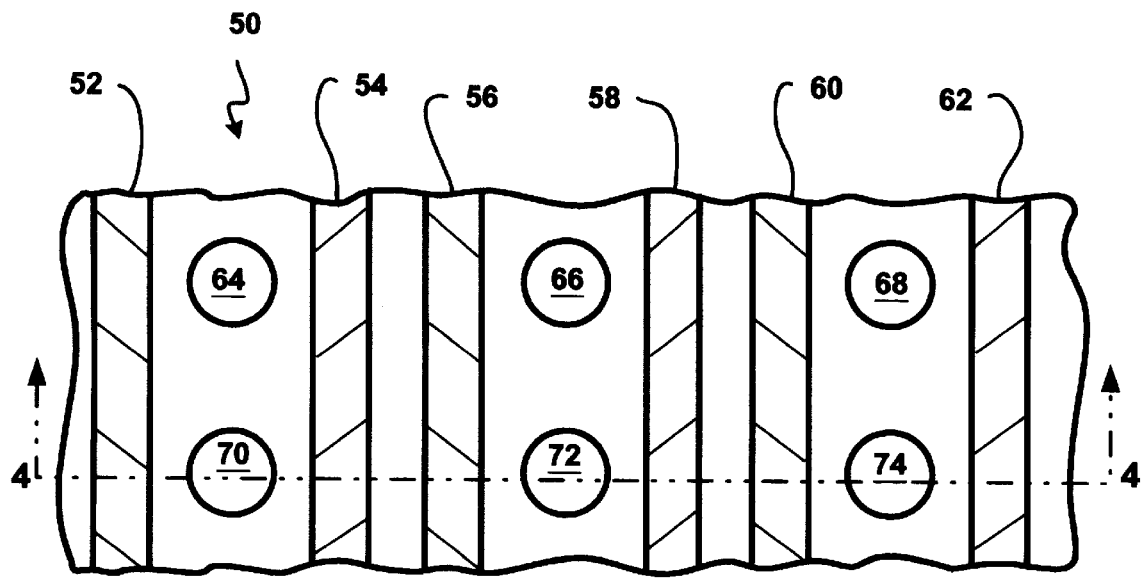
FIG. 3 is a top view of a portion of a semiconductor wafer showing the via arrangement of the present invention.

Referring now to FIG. 3, therein is shown is a top view of a portion of a semiconductor wafer 50 showing the via arrangement of the present invention. A plurality of stacked gate structures 52, 54, 56, 58, 60, and 62 are shown with interspersed vias 64, 66, 68, 70, 72, and 74. It should be noted that the vias 64, 66, and 68 are positioned in a row while the vias 64 and 70, 66 and 72, and 68 and 74 are positioned in columns. Further, it should be noted that the plurality of stacked gate structures 52, 54, 56, 58, 60, and 62 are straight and without bends.

Figure 4:
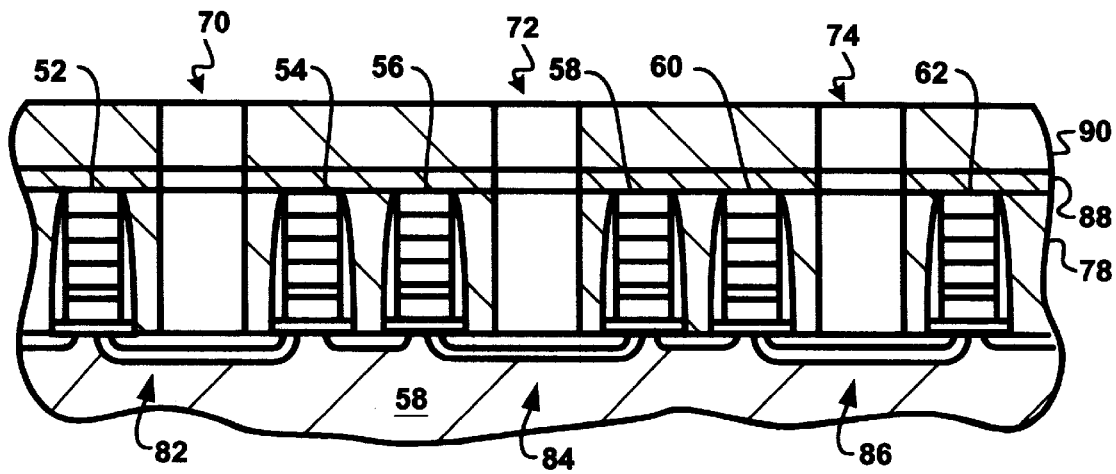
FIG. 4 is a partial cross-sectional view of FIG. 3 taken along line 4—4.

Referring now to FIG. 4, therein is shown a partial cross-sectional view of FIG. 3 taken along line 4—4. An interlayer dielectric 78 is deposited over the plurality of stacked gate structures 52, 54, 56, 58, 60, and 62 and a doped silicon substrate 80. The doping is shown at source/drain regions 82, 84, and 86. Over the interlayer dielectric 78 is deposited an anti-reflective coating (ARC) 88 which is generally a silicon oxynitride (SiON) and deposited over the ARC 88 is another dielectric layer 90. The vias 70, 72, and 74 extend through the interlayer dielectric 90, the ARC 88, and the interlayer dielectric 78 to the source/drain regions 82, 84 and 86, respectively.

Figure 5:
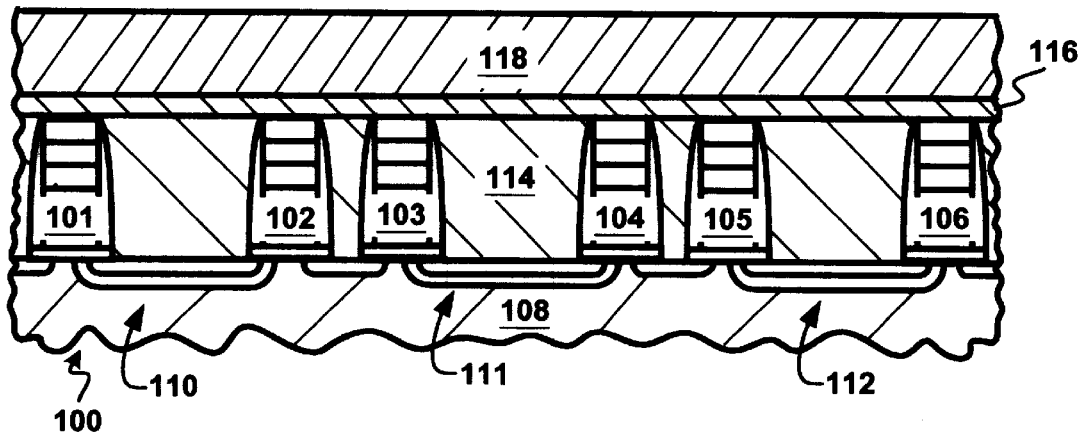
FIG. 5 is a partial cross-sectional view of semiconductor wafer after partial formation of a plurality of memory devices and the deposition of an ARC and a photoresist layers.

Referring now to FIG. 5, therein is shown a partial cross-sectional view of a semiconductor wafer 100 in a preliminary stage of manufacturing. In the preferred embodiment, which is for a silicon-based semiconductor, the wafer 100 at this stage of manufacturing will consist of a plurality of stacked gate structures 101 through 106 on a lightly doped silicon substrate 108. The doping is shown at source/drain regions 110 through 112. On top of the silicon substrate 108 is an interlayer dielectric 114 which has been planarized by chemical-mechanical polishing (CMP). On top of the interlayer dielectric 114 is an anti-reflective coating (ARC) layer 116. Also shown as part of the first step of the present invention is a photoresist layer 118. For sub-micron geometries, the photoresist 118 will generally be a deep ultraviolet photoresist which is deposited by spin coating. The silicon substrate 108 is silicon dioxide ($SiO_2$) and the ARC layer 116 is of silicon oxynitride (SiON).

Figure 6:
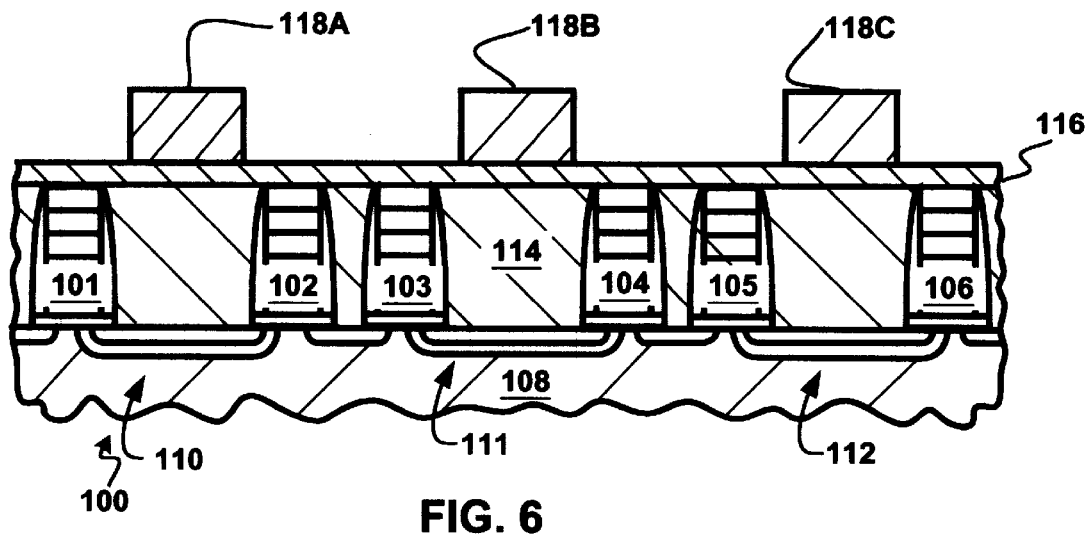
FIG. 6 is the partial cross-section of FIG. 5 after the photoresist has been patterned with the vias as structures and developed.

Referring now to FIG. 6, therein is shown the structure of FIG. 5 in which the photoresist 118 has been patterned with the vias desired in the same way that conventional structures, such as lines, are patterned in the conventional photolithographic process. The via photoresist structures 118A through 118C can be very precisely located and are developed to form a via photoresist structures 118A through 118C.

Figure 7:
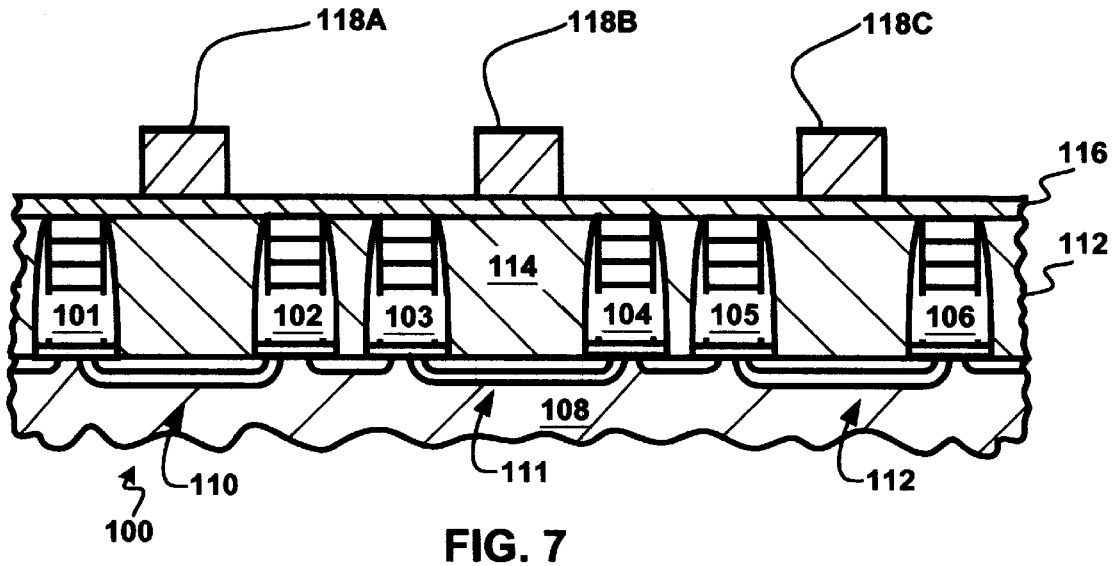
FIG. 7 is the partial cross-section of FIG. 6 after via photoresist structures have been trimmed.

Referring now to FIG. 7, therein is shown the structure of FIG. 6 where the via photoresist structures 118A through 118C may be dry trimmed by plasma etching to very precise sizes to tightly control the size of the vias. Precise control of the via size permits the fitting in of vias in positions which were previously not feasible.

Figure 8:
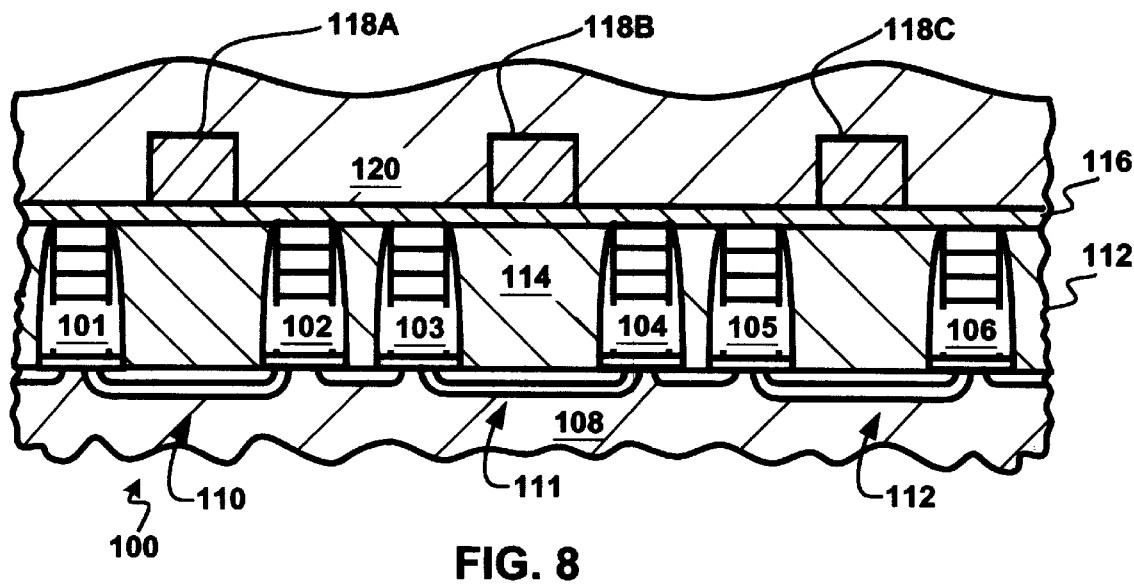
FIG. 8 is the partial cross-section of FIG. 7 in which a polymer has been spun on over the via photoresist structures.

Referring now to FIG. 8, therein is shown the structure of FIG. 6 after a polymer layer 120 has been deposited over the via photoresist structures 118A through 118C. The polymer layer 120 is a non-photosensitive polymer, which is generally deposited by spin coating or plasma polymerization. Its thickness should be greater than the thickness of the via photoresist structures 118 A through 118C.

Figure 9:
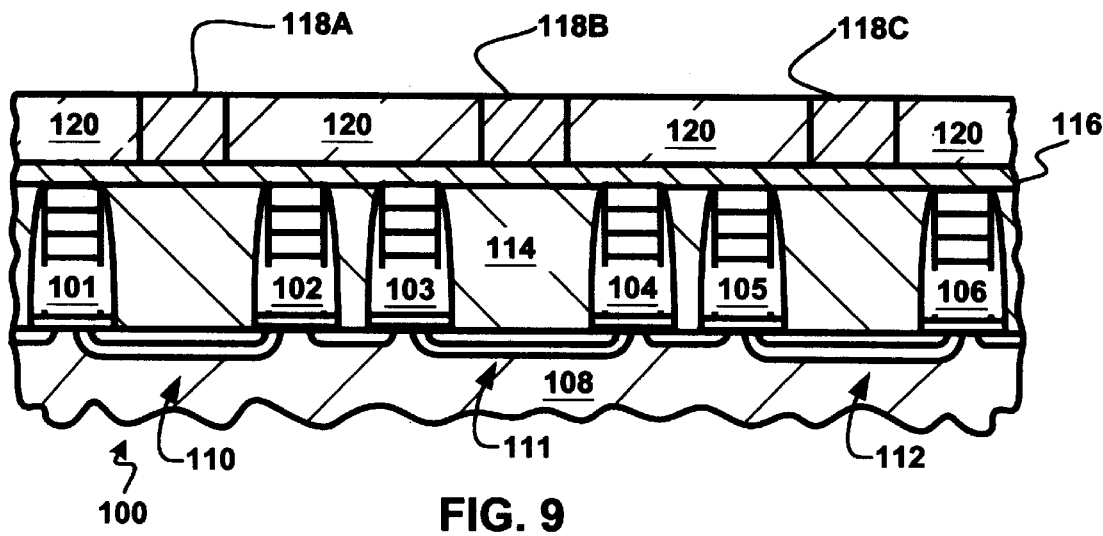
FIG. 9 is the partial cross-section of FIG. 8 in which the hardened polymer has been subject to a chemical-mechanical polishing to expose the photoresist and form the reverse image patterned polymer.

Referring now to FIG. 9, therein is shown the structure of FIG. 8 after chemical-mechanical polishing of the polymer layer 120 until the via photoresist structures 118A through 118C are exposed and the reverse image patterned polymer layer 120 is formed.

Figure 10:
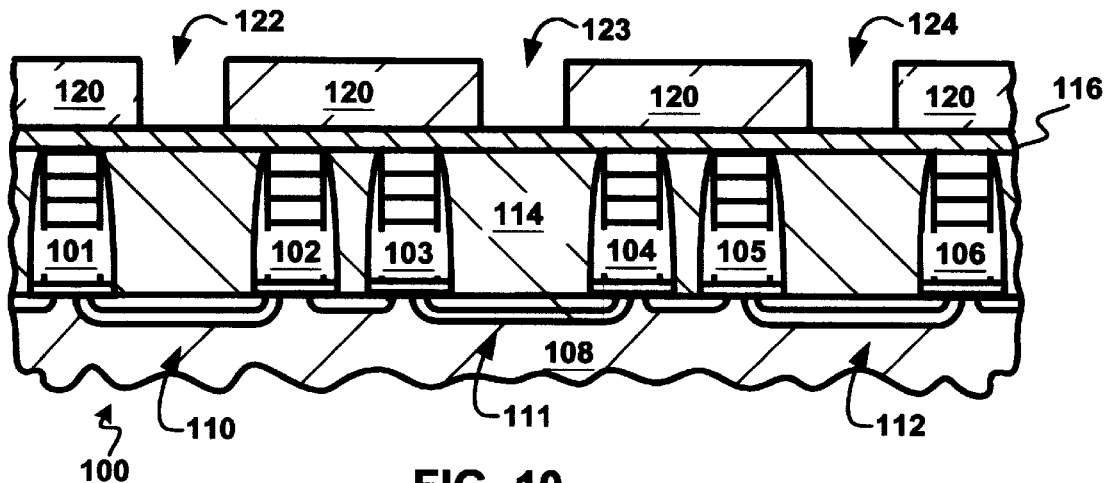
FIG. 10 is the partial cross-section of FIG. 9 in which the photoresist has been removed leaving the reverse image patterned polymer.

Referring now to FIG. 10, therein is shown the structure of FIG. 9 after developing to remove the via photoresist structures 118A through 118C. This leaves the reverse image patterned polymer layer 120 on the ARC layer 116. The reverse image pattern is of holes 122 through 124. The backs of the holes 122 through 124 are not shown in the interests of clarity.

Figure 11:
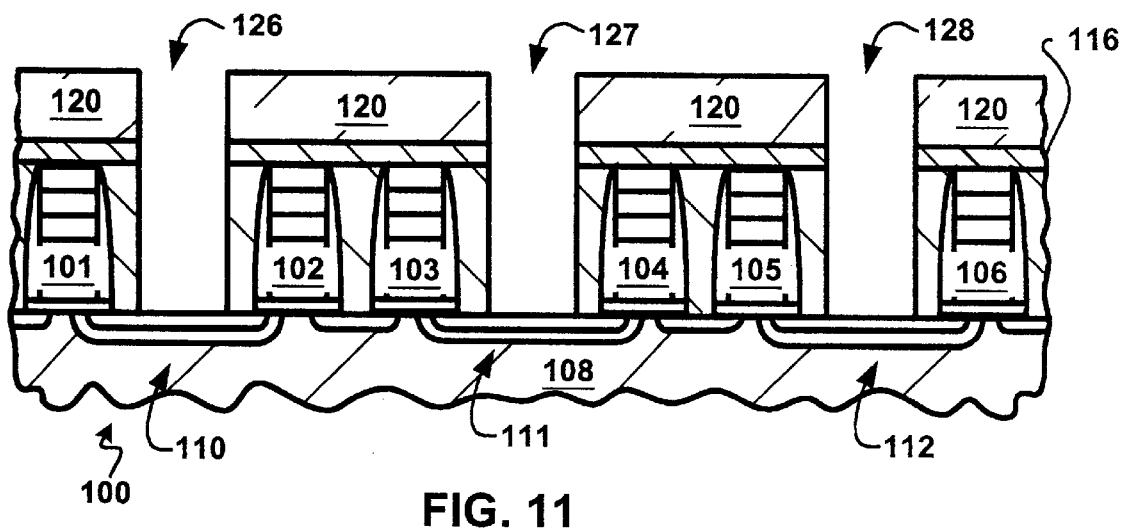
FIG. 11 is the partial cross-section of FIG. 10 in which the reverse image patterned polymer has been used in the etching of the vias to form the closely spaced devices.

Referring now to FIG. 11, therein is shown the structure of FIG. 10 after an anisotropic etch. The anisotropic etch uses the holes 122 through 124 in the reverse image patterned polymer layer 120 to etch vias 126 through 128 into the ARC layer 116 and the interlayer dielectric 114. FIG. 11 is the same as FIG. 1 except that the backs of the vias 126 through 128 are not shown in the interests of clarity.

The present invention may be described as a reverse lithographic process in which a photolithographic process is used to form structures which become the negatives for the vias. The structures are used for a reverse image pattern to be formed from a polymer which is then used as a mask to form the vias. This permits smaller and more precisely located vias than possible with current manufacturing processes using existing equipment.

The present invention is shown beginning with a semiconductor wafer 100 which has been processed to the point that that the stacked gate structures 101 through 106 and the source/drain regions 110 through 112 are completed. Also completed is the deposition of the interlayer dielectric 114 and its CMP. The initial step in processing is the deposition of the ARC layer 116 on the interlayer dielectric 114 and the deposition of the photoresist 118 on top, as shown in FIG. 5. The ARC layer 116 allows for sharper edges for the images patterned into the photoresist 118.

After deposition of the photoresist 118, a mask of the vias as structures is used to pattern and develop the photoresist 118 to form the via photoresist structures 118A through 118C shown in FIG. 6 on the ARC layer 116. For very precise sizing, the via photoresist structures 118A through 118C are dry etch trimmed to size by a process such as plasma etching. It will be noted that the precise location and sizing of the via photoresist structures 118A through 118C allow the stacked gate structures 101 through 106 to be both closer together and straight.

The polymer layer 120 is then deposited by spinning over the via photoresist structures 118A through 118C filling the spaces around the vias photoresist structures 118A through 118C. The polymer is deposited to a thickness greater than that of the thickness of the via photoresist structures 118A through 118C, as shown in FIG. 8. The deposition is of the non-photosensitive polymer by spin coating or plasma polymerization.

The polymer layer 120 is then subject to CMP until the via photoresist structures 118A through 118C are revealed, as shown in FIG. 9.

After the via photoresist structures 118A through 118C have been revealed, they are removed to leave the pattern of the vias and the reverse image patterned polymer layer 120, as shown in FIG. 10.

The holes 122 through 126 in the reverse image patterned polymer layer 120 are then used as a mask for anisotropic etching of the ARC 116 and the interlayer dielectric 114 down to the source/drain regions 110 through 112.

Conventional processing is used to fill the vias 126 through 128 with conductive material to contact the semiconductor substrate 108. The same process is used to form vias (not shown) to the stacked gate structures 101 through 106 at different locations. Further, the same process is used to form vias (not shown) in conventional processing which is used to form interlayer channels and to connect the vias among the channels as would be evident to those skilled in the art from the above disclosure.

As would be evident to those skilled in the art, the invention may be used with many different semiconductor materials, such as gallium arsenide, and configurations to manufacture smaller vias between elements and semiconductors as well as smaller connections between various elements.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method for manufacturing integrated circuits comprising the steps of:
    depositing a photoresist over a semiconductor wafer having a semiconductor device formed thereon covered by a dielectric;
    patterning said photoresist with a pattern of vias;
    exposing said photoresist in said pattern of vias;
    developing said photoresist in said pattern of vias to form via photoresist structures;
    depositing a polymer on said semiconductor wafer over said via photoresist structures;
    removing a portion of said polymer to reveal said via photoresist structures;
    developing said via photoresist structures to leave a reverse image patterned polymer;
    anisotropically forming vias using said reverse image patterned polymer as a mask.

2. The method as claimed in claim 1 wherein said step of patterning said photoresist uses a pattern of the vias in rows and columns.

3. The method as claimed in claim 1 including a step of forming a semiconductor device having stacked gate structures that are straight.

4. The method as claimed in claim 1 wherein said steps of depositing, patterning, exposing, developing, depositing, removing, developing, and anisotropically forming are performed between channels disposed in additional layers of dielectric.

5. The method as claimed in claim 1 wherein said step of depositing said polymer uses a non-photosensitive polymer.

6. The method as claimed in claim 1 including a step of planarizing of said polymer after said step of depositing said polymer.

7. The method as claimed in claim 1 including the step of trimming said via photoresist structures after developing.

8. The invention as claimed in claim 1 wherein said step of forming vias forms vias to said semiconductor device.

9. A method for manufacturing integrated circuits comprising the steps of:
    depositing an anti-reflective coating over a semiconductor wafer having semiconductor devices formed thereon covered by a chemically-mechanically polished dielectric;
    depositing a photoresist on said anti-reflective coating;
    patterning said photoresist with a pattern of vias;
    exposing said photoresist in said pattern of vias;
    developing said photoresist to remove said photoresist to form via photoresist structures;
    depositing a polymer on said semiconductor wafer over said via photoresist structures;
    chemical mechanical polishing a portion of said polymer to reveal said via photoresist structures;
    removing said via photoresist structures to leave a reverse image patterned polymer;
    anisotropically etching said anti-reflective coating and said dielectric to form vias using said reverse image patterned polymer as a mask.

10. The method for manufacturing integrated circuits as claimed in claim 9 wherein said step of patterning said photoresist provides a pattern of vias in rows and columns.

11. The method for manufacturing integrated circuits as claimed in claim 9 including a step of forming said semiconductor devices as memory devices having stacked gate structures that are straight.

12. The method for manufacturing integrated circuits as claimed in claim 9 wherein said steps of depositing, patterning, exposing, developing, depositing, polishing, removing, and etching are performed between channels disposed in additional layers of dielectric.

13. The method for manufacturing integrated circuits as claimed in claim 9 wherein said step of anisotropically etching forms vias to said semiconductor devices and to channels interconnecting said semiconductor devices.

14. The method for manufacturing integrated circuits as claimed in claim 9 wherein said step of developing uses a photolithographic process which overexposes said photoresist whereby the spaces in said photoresist are reduced in size.

15. The method for manufacturing integrated circuits as claimed in claim 9 including the step of plasma trimming said via photoresist structures after developing whereby the size of the vias photoresist structures can be tightly controlled.

16. The method for manufacturing integrated circuits as claimed in claim 9 wherein said step of depositing said photoresist uses a deep ultraviolet photoresist.

17. A method for manufacturing integrated circuits comprising the steps of:
    chemical-mechanical polishing a silicon oxide layer over memory devices having straight stacked gate structures;
    depositing a silicon oxynitride layer on said silicon oxide layer;
    depositing a deep ultraviolet photoresist on said silicon oxynitride layer;
    patterning said photoresist with a pattern of vias;
    exposing said photoresist to deep ultraviolet light in said pattern of vias;
    developing said photoresist in said pattern of vias to form via photoresist structures;

depositing a non-photosensitive polymer over said via photoresist structures;

chemical-mechanical polishing said polymer to reveal said via photoresist structures;

developing said via photoresist structures in said pattern of vias to leave a reverse image patterned polymer; and anisotropically removing said silicon oxynitride layer through said reverse image patterned polymer;

anisotropically removing said silicon oxide layer through said reverse image patterned polymer and said silicon oxynitride layer; and removing said reverse image patterned polymer.

18. The method for manufacturing integrated circuits as claimed in claim 17 wherein said steps of anisotropically removing said silicon oxynitride and silicon oxide layers form vias in rows and columns.

19. The method for manufacturing integrated circuits as claimed in claim 18 including a step of hardening said polymer after said step of depositing said polymer.

20. The method for manufacturing integrated circuits as claimed in claim 19 including a step of planarizing said reverse image patterned polymer after said step of depositing said polymer.

* * * * *